United States Patent [19]
Miyano et al.

[11] Patent Number: 5,440,171
[45] Date of Patent: Aug. 8, 1995

[54] SEMICONDUCTOR DEVICE WITH REINFORCEMENT

[75] Inventors: Ichiro Miyano; Kooji Serizawa, both of Fujisawa; Suguru Sakaguchi, Chigasaki; Toshiharu Ishida, Fujisawa, all of Japan

[73] Assignee: Hitachi, Ltd., Tokyo, Japan

[21] Appl. No.: 27,478

[22] Filed: Mar. 8, 1993

[30] Foreign Application Priority Data

Mar. 9, 1992 [JP] Japan .................................. 4-050372

[51] Int. Cl.$^6$ ............................................. H01L 25/00
[52] U.S. Cl. .................................. 257/700; 257/723; 257/724; 257/924
[58] Field of Search .............. 257/723, 724, 700, 924, 257/728, 528, 532

[56] References Cited

U.S. PATENT DOCUMENTS 4,038,488 7/1977 Lin ........................................ 257/723
5,028,986 7/1991 Sugano et al. .

FOREIGN PATENT DOCUMENTS 3-102862 4/1991 Japan .

*Primary Examiner*—William Mintel
*Assistant Examiner*—Roy Potter
*Attorney, Agent, or Firm*—Antonelli, Terry, Stout & Kraus

[57] ABSTRACT

In a tape carrier type semiconductor device with reinforcement wherein tape carrier type semiconductor modules are mounted in holes or depressions enclosed by a frame, and at least one flexible circuit is stacked additionally as required, and the semiconductor modules are electrically connected to electrodes formed on the frame, by mounting chip parts such as capacitors on the frame and/or flexible circuit, the mounting area of the semiconductor device can be reduced and the performance can be hyperfunctioned. By stacking a plurality of such semiconductor devices with reinforcement, much more satisfactory effects can be obtained.

34 Claims, 9 Drawing Sheets

SEMICONDUCTOR DEVICE WITH REINFORCEMENT

BACKGROUND OF THE INVENTION

The present invention relates to electronic apparatuses which are mounted with many LSI parts and required to be miniaturized, and, more particularly, to a hyperfunctioned semiconductor device which can be made extremely dense.

A semiconductor device wherein a plurality of tape carrier type semiconductor modules which are connected electrically to frames are prepared and connected and stacked to each other via electrodes on the frames is indicated in Japanese Patent Laid-Open No. 2-198148. The U.S. patent application Ser. No. 07/631154 also shows a similar technique, and is pending now. In this shape, mounting in high density by stacking only LSIs is realized. However, mounting in high density of functional parts including chip parts which are necessary to improve the function of the structural circuit is not taken into account. Therefore, it is required to mount those function improving parts in the neighboring area of the stacking type semiconductor device by soldering them later in the conventional way and the entire function circuit unit is not always as dense as desired.

As to parts which are mounted on products such as personal computers and work stations which have been increasingly downsized, lightened, and hyperfunctioned, the parts are requested to be miniaturized, hyperfunctioned, and highly densified. When mounting LSIs which are used for those apparatuses, tape carrier type semiconductor modules which are characterized by being thin are frequently used at present.

Chip parts such as capacitors for improving characteristics of a semiconductor device during high speed operation and for protecting the semiconductor device from power noise are mounted in the neighboring area of the semiconductor device. Therefore, even if the semiconductor device and parts are miniaturized as far as possible, an increase in the mounting area corresponding to a semiconductor device cannot be ignored due to the wiring area of the chip parts in the neighboring area of the device.

SUMMARY OF THE INVENTION

An object of the present invention is to provide a semiconductor device, which is free from the problem inherent in the aforementioned prior art, and wherein the wiring around the semiconductor device when parts are mounted on a substrate is simplified, and the number of input and output terminals is reduced, and the variety of terminal position setting is increased. Another object of the present invention is to provide the structure of a semiconductor device for modularizing the semiconductor device in the highly hyperfunctioned and densified state, reducing the mounting area, and improving the performance. A further object of the present invention is to provide a semiconductor device having a tape carrier type semiconductor module wherein the performance is hyperfunctioned and the mounting density is increased.

To accomplish the above objects, the semiconductor device of the present invention is a semiconductor device with reinforcement having at least a semiconductor module and frame such as, for example, a tape carrier type semiconductor device with reinforcement, wherein circuit lines and electrodes are formed in a section other than the semiconductor module of the semiconductor device with reinforcement, and wherein chip parts such as capacitors are mounted in that section. The frame can be a single layer or multi-layer. When the thickness of the frame ranges from 0.6 mm to 1 mm, generally at most six wiring layers may be formed in the frame. However, there is no need to restrict it.

The section where circuit lines and electrodes are formed and chip parts are mounted is a part of a single layer or multi-layer frame or a section on a thin substrate, which is newly connected to the frame, such as a flexible circuit. The flexible circuit may be a known substrate, which is generally 75 $\mu$m to 125 $\mu$m in thickness and made of polyimide. However, the thickness is a problem of design and there is no need to restrict it.

The frames are generally made of glass-epoxy, though the frame may be made of ceramics. The frame thickness is often about 1.3 times of the chip thickness of a semiconductor module. However, there is no need to restrict it.

When, for example, a semiconductor chip mounted on a carrier tape is a DRAM (an abbreviation for dynamic random access memory), a capacitor having a capacitance of about 0.1 to 1 $\mu$F is used generally for two memory chips so as to reduce power noise and to improve the high frequency characteristics during high speed operation.

When these chip parts 3 are mounted on a substrate 17 around a semiconductor device as shown in FIG. 11, the mounting area in the section other than where the parts are mounted is spread. However, when the structure of the present invention is used, chip parts are built in a composite of semiconductor module and reinforcement frame or circuit lines of a flexible circuit, so that the circuit lines on the mother board can be simplified. Since the entire mounting structure is arranged three-dimensionally, the mounting area can be reduced substantially.

According to the basic structure that a tape carrier type semiconductor module 1 and frame 2 are electrically connected, it is possible to stack a plurality of layers by making the best use of the thin structure, to improve the performance, and to increase the mounting density. Also in this case, the chip parts 3 such as capacitors in the necessary number corresponding to the number of semiconductor chips incorporated in the device are soldered and mounted later in the conventional way. In the case of an SOJ (an abbreviation for small outline J-lead package) package having no stacking structure, by using the space between another device and the substrate, chip type parts can be mounted in the gap right under the device. However, as to a semiconductor device using a tape carrier type semiconductor module which is characterized by being thin, it is necessary to mount it without a gap being provided on the substrate so as to reduce the thickness of the entire circuit substrate when it is mounted. A special method for mounting chip parts in a depression which is formed in the substrate right under the semiconductor device may be used, though the cost is increased.

According to the structure of the present invention, the chip parts 3 for improving characteristics can be built in a semiconductor device (for example, a tape carrier type semiconductor device) in the three-dimensional shape, so that, for example, an extra increase in the mounting area other than the tape carrier type semiconductor module 1 and frame 2 can be stopped. In addition, circuit lines are built in the semiconductor device, so that the circuit lines on the substrate can be simplified and the number of input and output terminals for each semiconductor device can be reduced.

DESCRIPTION OF THE PREFERRED EMBODIMENTS

Embodiment 1

Figure 1:
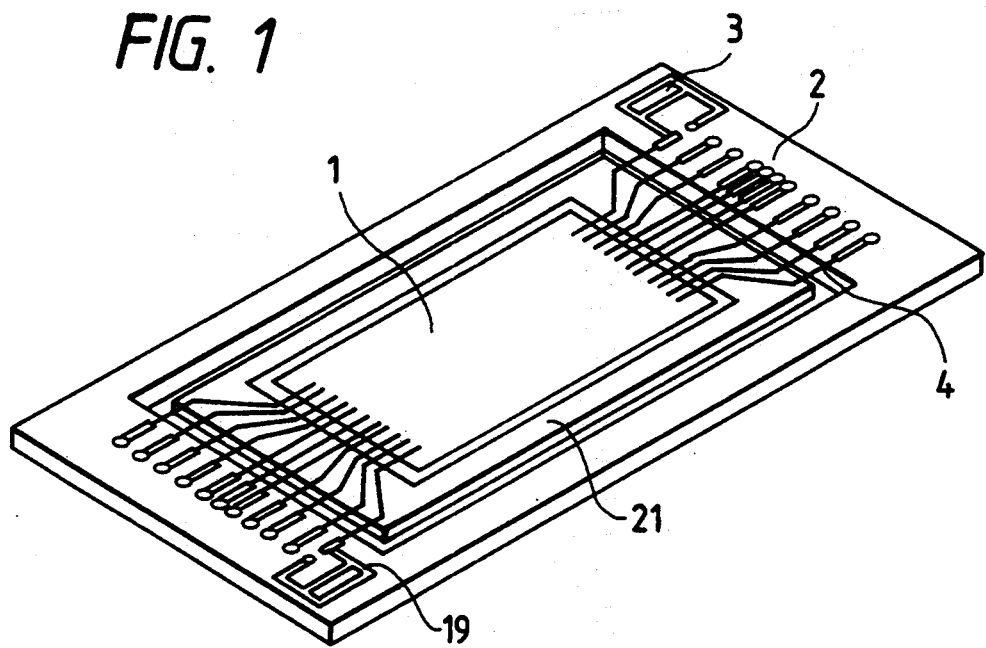
FIG. 1 is a schematic perspective view for explaining the basis structure of a semiconductor device of an embodiment of the present invention.
Figure 4:
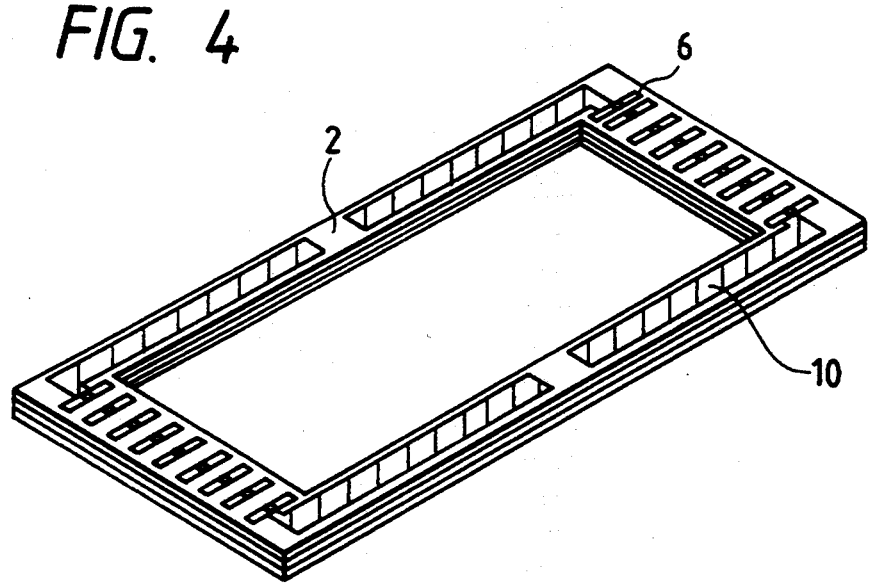
FIG. 4 is a perspective view of a frame having a heat radiation pattern on the surface of an embodiment of the present invention.

The basic structure of the present invention using a tape carrier type semiconductor module 1 and frame 2 for reinforcing it, which is made of glass-epoxy, are shown in FIG. 1. The TAB (an abbreviation for tape automated bonding) technique, which is conventionally used, is used for bonding the tape carrier to the semiconductor chip. Epoxy resin is coated on the electrodes of the semiconductor chip and tape carrier which are bonded by the TAB technique and the neighboring area by potting or molding so as to protect the electrodes and connected part. To protect the tape carrier type semiconductor module 1 and frame 2 from interference in shape, the tape carrier type semiconductor module 1 is bonded electrically to the frame 2 which has a device hole 18 formed therein.

For bonding the frame 2 to the tape carrier type semiconductor module 1, a method is used wherein electrodes, which are formed on the frame by etching the coated conductor layer or electroless copper plating are plated with solder, and lead electrodes 4 with solder plating on the tape carrier type semiconductor module are positioned and reflow-soldered to the frame electrodes. In FIG. 1, numeral 21 indicates a tape carrier which is made of polyimide resin. The tape carrier is used to support the lead electrodes 4 of the semiconductor chip.

Figure 2:
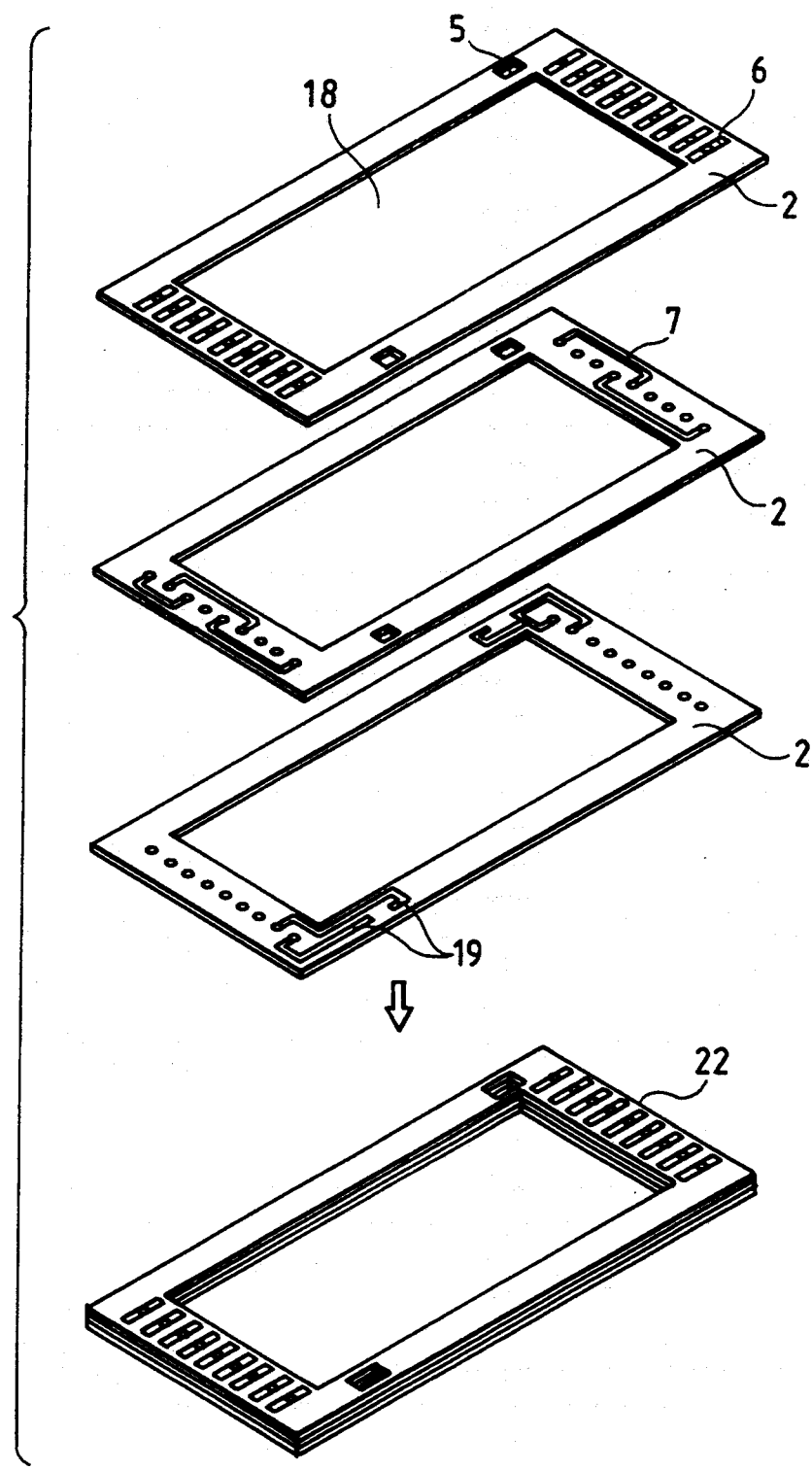
FIG. 2 is a schematic perspective view showing the structure of a multi-layered frame of an embodiment of the present invention.

Instead of a conventional frame, wherein electrodes which are used to electrically bond the tape carrier type semiconductor module and frame and foot patterns which are used to mount the semiconductor device on the substrate 17 are provided on the top and bottom surfaces and through holes for connecting the electrodes and foot patterns are formed, by using a multilayer wiring frame 22 having four wiring layers including the top and bottom surfaces of the frame and two inner wiring layers as shown in FIG. 2, circuit lines 7 and electrodes 19 can be formed within the frame.

Figure 3A:
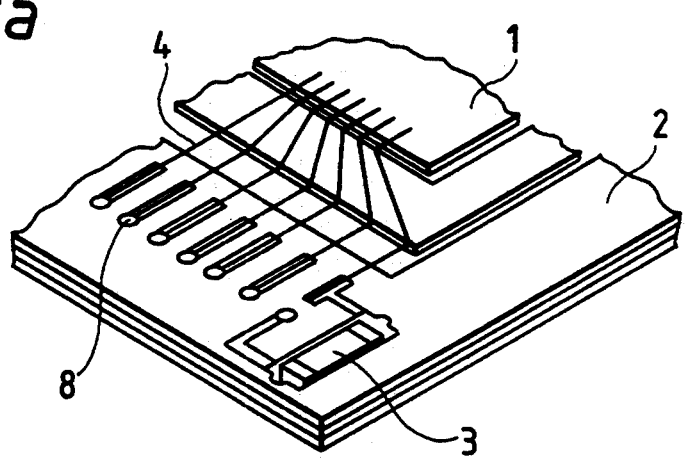
FIGS. 3a and 3b are partially enlarged perspective views showing a tape carrier type semiconductor device having a multi-layered frame of an embodiment of the present invention.
Figure 3B:
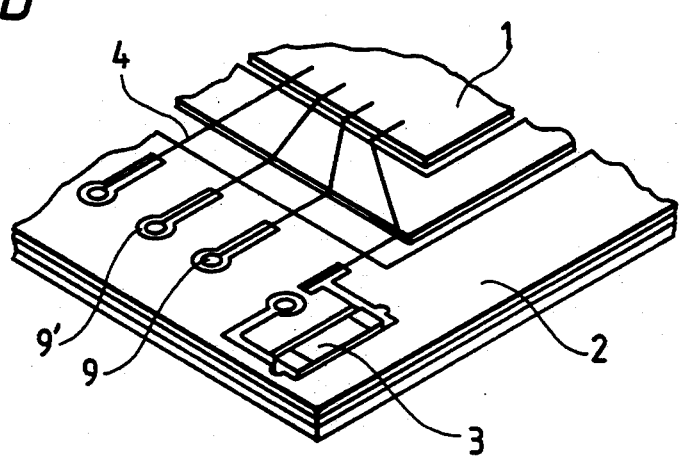

According to this method, the degree of freedom of the circuit lines in the frame can be increased, so that each electrode can be moved to an optional location. By miniaturizing through holes for electrically shorting each layer when a multi-layered substrate is used by using landless through holes 8 having no land 9', as shown in FIG. 3a, the external size of the frame can be minimized and the electrode pitch of the tape carrier frame can be reduced. FIG. 3b shows through holes 9 having lands.

Chip parts are bonded beforehand to the mounting electrodes 19 shown in FIG. 2 with Pb-Sn solder with a melting point of 250° C. The reason is to carry out hierarchical soldering which can sufficiently withstand 210° C. at which the tape carrier type semiconductor module 1 and frame 2 are reflow-soldered.

Depressions are formed in the neighboring area of the electrodes 19, shown in FIG. 2, on the frame 2 whereon the chip parts 3 are mounted by the fabricating operation shown in FIGS. 3a and 3b and the chip parts 3 are prevented from protrusion from the frame, so that the external size can be minimized. The electrodes 19 for mounting the chip parts are positioned so that they do not interfere with the electrodes of the tape carrier type semiconductor module 1 and frame 2.

To increase the effect of a capacitor so as to remove noise and to improve the high frequency characteristics, it is necessary to connect the capacitor in the neighborhood of the target semiconductor part at a short wiring distance as far as possible so as to reduce the line impedance. By mounting the capacitor via the circuit line on the frame, the effect can be improved. The thickness of the tape carrier type semiconductor module depends on the resin thickness on the chip surface and the thickness of the semiconductor chip. However, the thickness of the semiconductor chip can be thinned to about 0.2 to 0.3 mm by grinding, so that the thickness of the entire device can be made thinner than that of a resin mold type package such as an SOP (small outline package) with a height of about 3 mm. Resin is adhered by potting and the thickness is generally at most 80 μm. According to this embodiment, the thickness is about 45 μm. The frame thickness is about 1.3 times of the chip thickness.

As a material of the frame, when a semiconductor chip with high power consumption is mounted, ceramics with high thermal conductivity such as silicon nitride or alumina to take into consideration the heat radiation from the parts and heat resistance. In such a case, the ceramic material is used as a heat radiation member or heat conduction path to the substrate. Furthermore, a part of the circuit lines on the frame surface may be spread and used as a heat radiation pattern 10.

Embodiment 2

Figure 5:
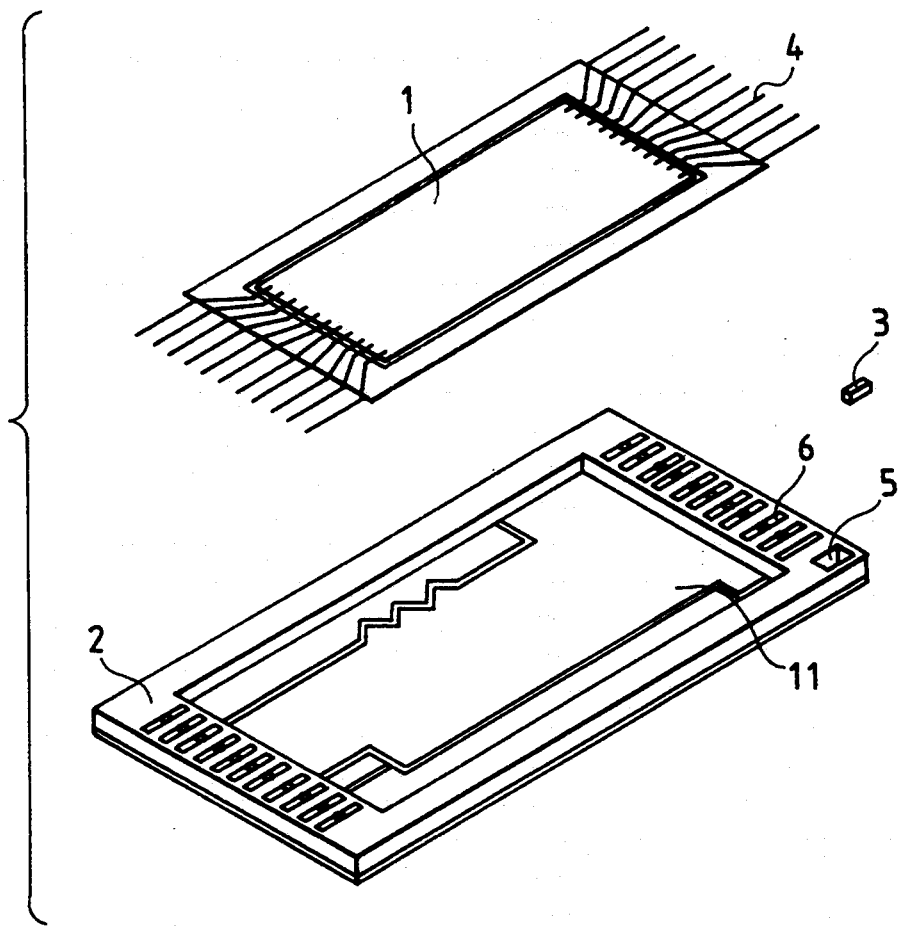
FIG. 5 schematic exploded perspective view showing a tape carrier type semiconductor device using a flexible circuit for internal circuit lines of another embodiment of the present invention.
Figure 6:
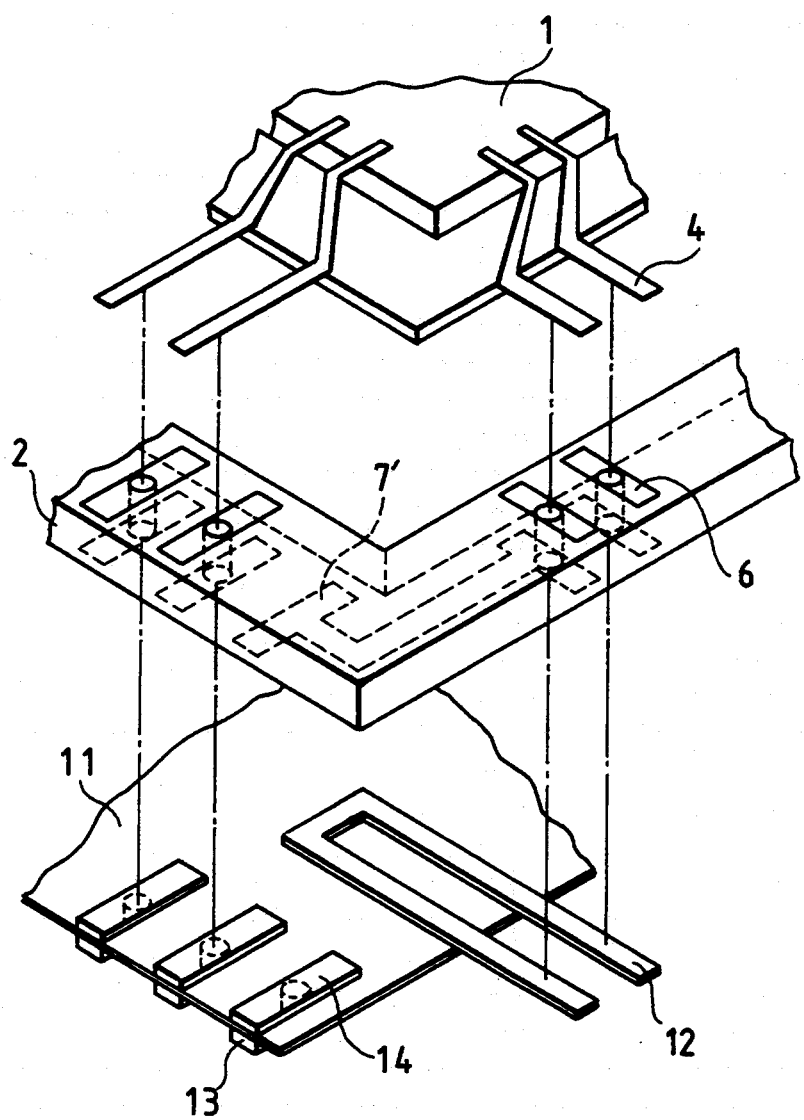
FIG. 6 is an enlarged perspective view for explaining the connection parts of a frame, flexible circuit, and tape carrier type semiconductor module of another embodiment of the present invention.
Figure 7:
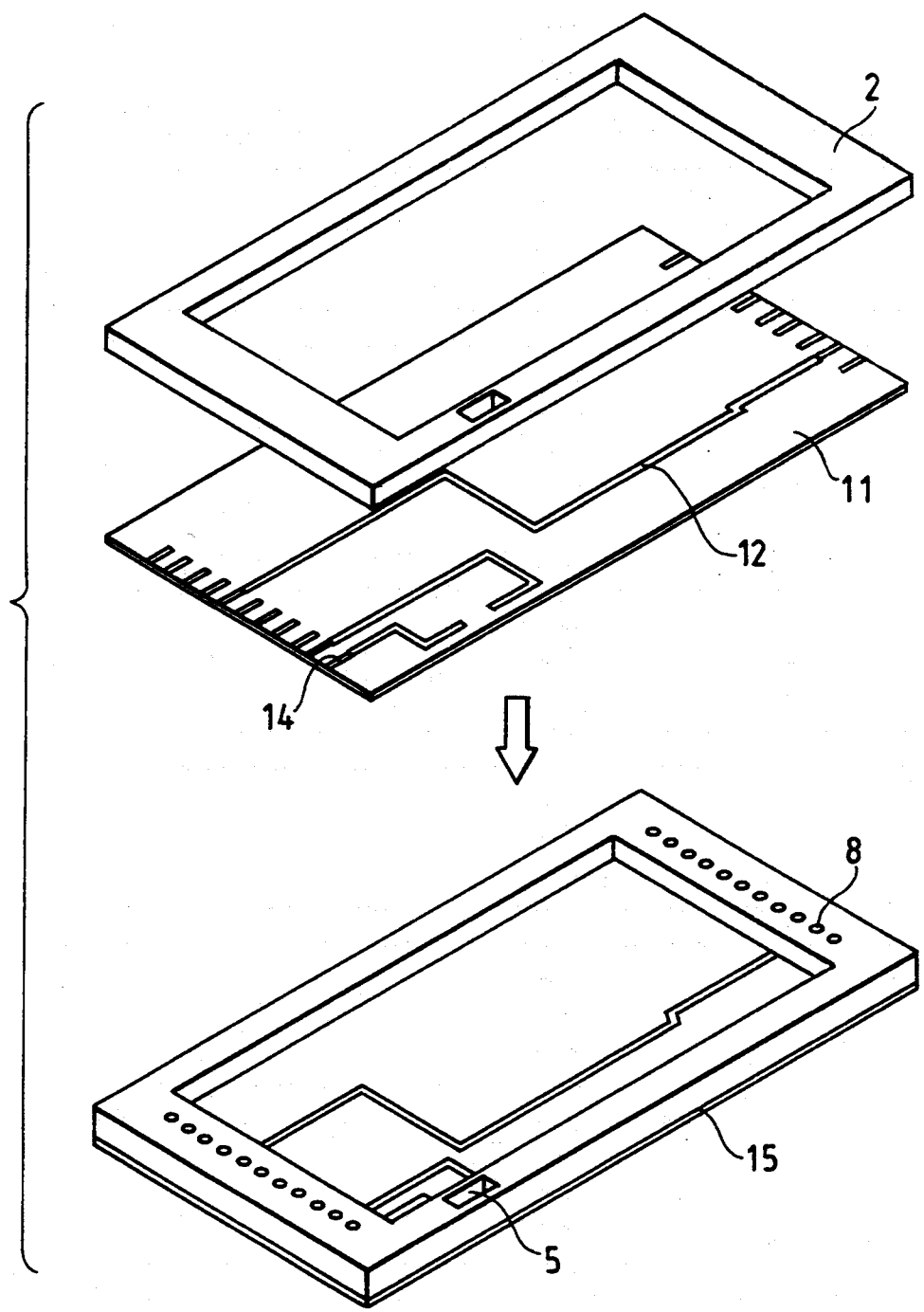
FIG. 7 is a schematic perspective view showing the bonding status of a frame and flexible circuit by thermosetting resin of another embodiment of the present invention.

A structure example that the tape carrier type semiconductor module 1 and frame 2 shown in Embodiment 2 are used as a basic structure unit and a flexible circuit 11 which has no device hole and can be wired is used is shown in FIG. 5. The flexible circuit 11 is a polyimide film with a thickness of about 125 μm and circuit lines are formed on both sides thereof using copper foil. According to this method, there are no restrictions on the circuit line dimensions due to the device hole 18 at the mounting location of the tape carrier type semiconductor module and to the through holes 8 of the frame 2, so that the circuit line width can be spread or the circuit line scale can be increased. Furthermore, the electric characteristics can be improved (for example, reduction of electromagnetic noise) due to increase in the circuit line width and thickness. In this case, in addition to electrodes 6 which are used to connect the tape carrier type semiconductor module 1, electrodes 7' which are used to electrically connect the flexible circuit 11 are formed on the frame 2 as shown in FIG. 6. In FIG. 6, a tape carrier type semiconductor module wherein lead electrodes 4 are extended from the four sides is used as a tape carrier type semiconductor module 1. To connect the tape carrier type semiconductor module 1 and frame 2, a method that they are positioned and connected against the frame surface in a batch and a method that as to the frame 2 and flexible circuit 11 shown in FIG. 7, the frame 2 is bonded to the flexible circuit 11 with heat resistant resin 15 such as polyimide resin and the electrical continuity between the tape carrier type semiconductor module and flexible circuit is ensured by the copper-plated through holes 8 formed so as to pass through the frame from the flexible circuit are used.

According to a structure example that a circuit line 12 is formed on the above flexible circuit 11, it is necessary only to form through holes, which are used to connect the electrodes on the top and bottom surfaces of the frame for the tape carrier type semiconductor module and the electrodes for mounting the substrate, on the frame 2. Therefore, the cost can be decreased by simplifying the frame wiring and the number of electrode pins for the tape carrier type semiconductor module can be increased.

The electrodes for mounting the substrate may be formed on the flexible circuit or at a part where the frame and flexible circuit are integrated.

Figure 8:
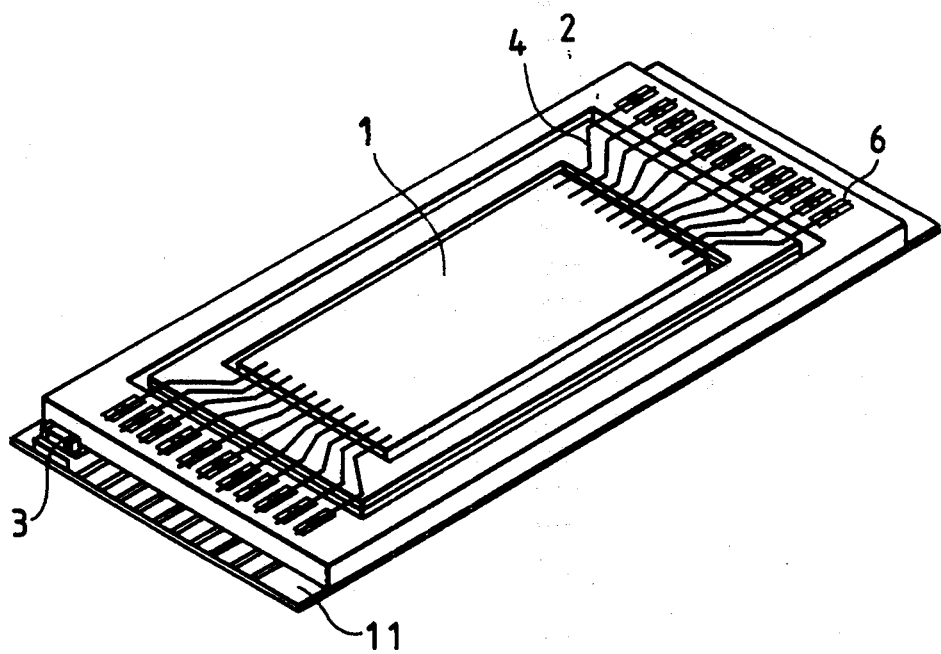
FIG. 8 is a perspective view showing an embodiment of a tape carrier type semiconductor device wherein chip parts are mounted on a flexible circuit.

The chip parts 3 for improving the electric characteristics may be mounted to the electrodes on the frame as shown in FIG. 5 or to the electrodes on the flexible circuit 11 for leading the circuit lines as shown in FIG. 8. According to this embodiment, the chip parts are mounted on the flexible circuit. In either case, to prevent an increase in size due to the chip parts and to protect interference with the neighboring part, depressions are formed in the neighboring area of the electrodes for mounting the chip parts in accordance with the shape of the chip parts 3.

When ceramics such as silicon nitride with high thermal conductivity are used as a frame material, the frame ensures a heat radiation path when LSI with high power consumption and a high calorific value are mounted and can be used as a heat radiation fin.

Figure 9A:
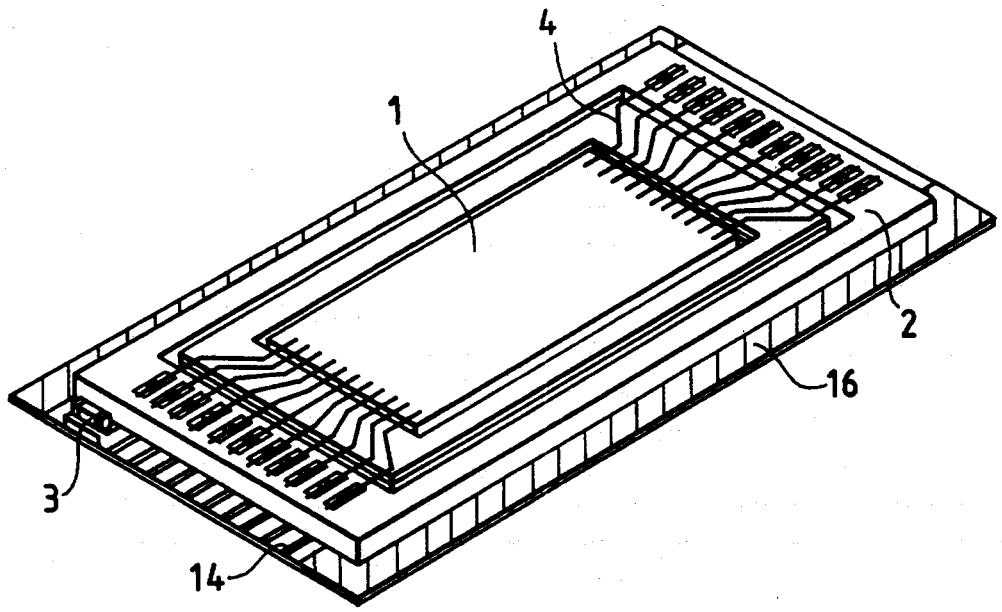
FIGS. 9a and 9b are perspective views showing an embodiment of a tape carrier type semiconductor device wherein a flexible circuit is used as a heat radiation
Figure 9B:
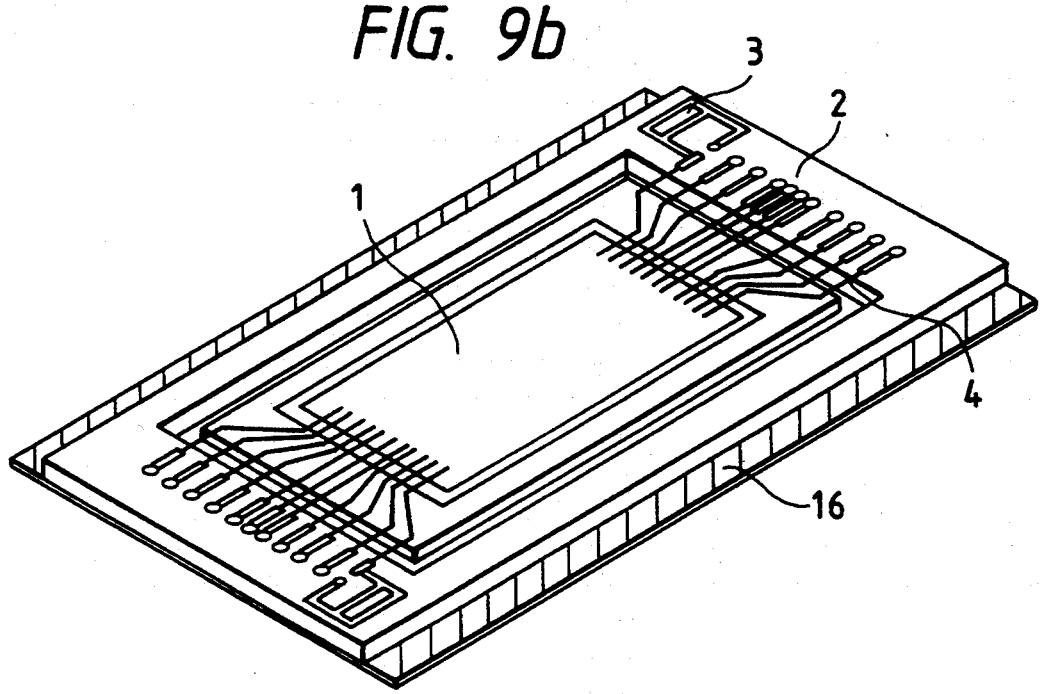

For example, a copper foil heat radiation pattern 16 which is not related to the circuit lines may be formed directly on the end face of the flexible circuit as shown in FIGS. 9a and 9b so as to use a heat radiation fin.

Numeral 5 shown in FIG. 5 and others indicates a depression, and numeral 14 shown in FIG. 6 and others indicates an electrode for connecting the flexible circuit and frame, and numeral 13 indicates an electrode for connecting the semiconductor device of the present invention to the substrate 17.

Embodiment 3

Figure 10:
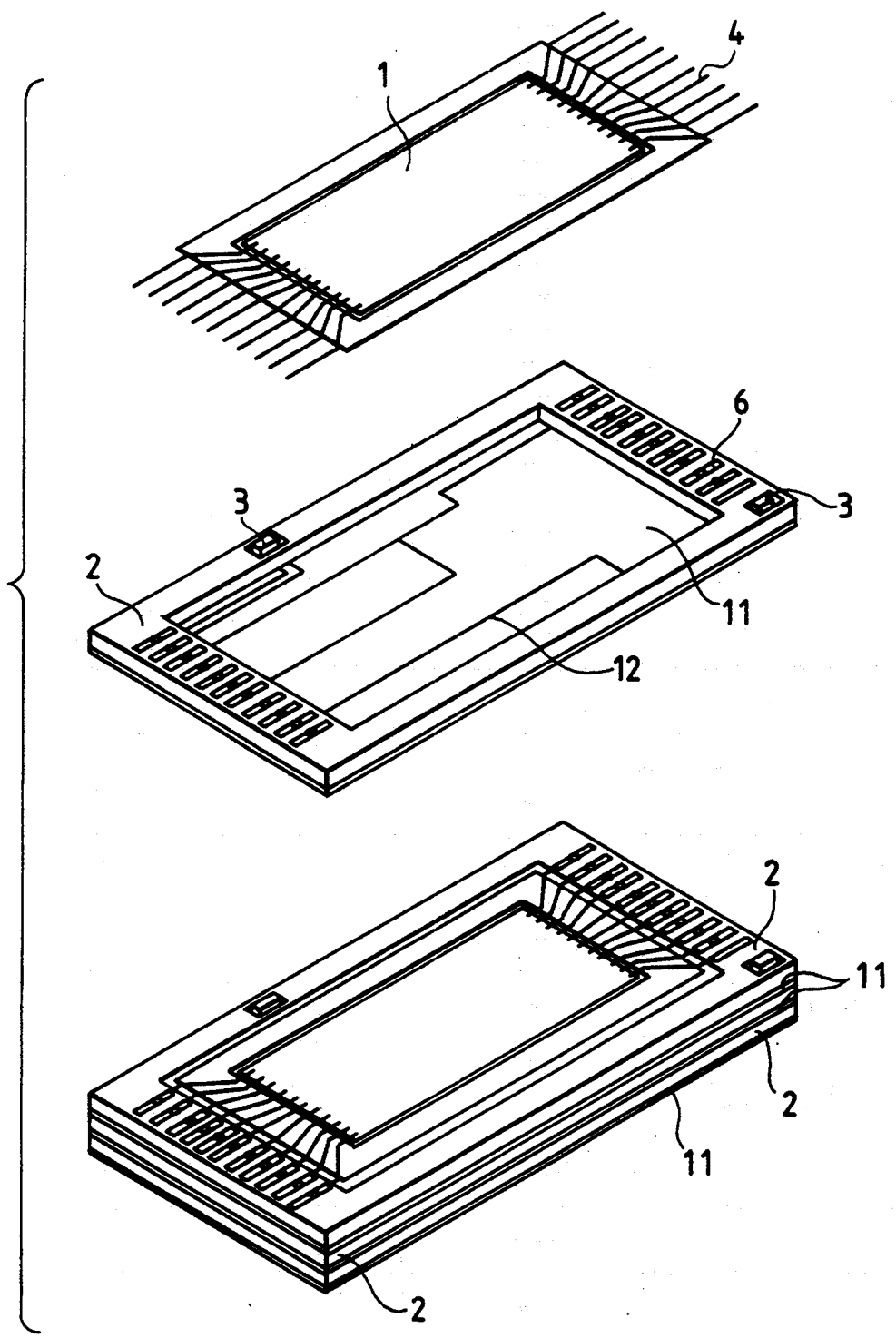
FIG. 10 is a schematic perspective view showing the structure of a stacked tape carrier type multi-chip semiconductor device of a further embodiment of the present invention.

By stacking semiconductor devices wherein the tape carrier type semiconductor module 1 and frame 2 shown in Embodiments 1 and 2, flexible circuit 11, and chip parts 3 connected on the frame 2 constitute a basic structure using an adhesive, for example, such as epoxy resin as shown in FIG. 10, the equipment can be highly densified and hyperfunctioned furthermore. In this case, when a DRAM is mounted as an LSI, one capacitor or so is used per two memory chips so as to reduce the power noise and to improve the characteristics during high speed operation. The power circuit between the power unit and capacitor for each chip and the chip select circuit for determining the layer where the chip operates can be wired inside the semiconductor device, so that the wiring electrodes on the substrate where the semiconductor device is mounted, particularly in the neighboring area of the semiconductor device can be simplified.

For example, when a flexible circuit 11 wherein multi-layer circuit lines are formed is used, the restriction on the number of electrodes caused by interference between the through holes and foot print and the restriction on the arrangement thereof can be removed by changing the location of each electrode. Since the chip parts 3 are mounted in the device three-dimensionally, no mounting area for the chip parts is required for the part mounting substrate. Even if the number of stacking chips is increased and the number of accessory parts is increased, the mounting area can be reduced and parts can be mounted in high density.

Embodiment 4

An application example of a semiconductor device including stacked devices having the tape carrier type semiconductor module 1, frame 2, flexible circuit 11, and chip parts 3 of the present invention, described in Embodiment 3, which are basic elements and electrically connected so as to form a circuit, wherein mounted LSIs are used as memories and the memory capacity of each device is increased by times of the number of layers without the mounting area being changed is shown. The structure is the same as that shown in FIG. 10. When the memory LSIs in the device operate at high speed, noise is generated in the power unit and ground layer by the circuit line impedance in the device. Therefore, chip capacitors with a capacity of 0.1 to 1 μF are used as chip parts 3 so as to reduce it. Using the structure of the present invention, chip parts in the number corresponding to the number of memory LSIs in the device are built in. A chip select circuit for selecting the chip operation is also built in the flexible circuit 11.

According to the structure containing no chip parts 3 indicated in Japanese Patent Laid-Open No. 2-198148, although depending on the power consumption of each LSI, when a heat radiation pattern using copper foil with a thickness of 35 μm is mounted on the surface of a 4-MB DRAM with power consumption of at most 0.5 W, and the thermal conductivity of the substrate is improved, and heat is effectively radiated in the atmosphere, the DRAM can operate simultaneously with at most about four stacked layers (2 W for each semiconductor device). In this case, the chip capacitors are mounted outside the layers. When stacking LSIs having a calorific value higher than it, it is necessary to use a material with high thermal conductivity such as ceramics as a substrate and to use the substrate positively as a heat radiation fin. A material with high thermal conductivity is also used as a material of the frame 2 so as to reduce the thermal resistance between the parts and substrate. The heat radiation of the equipment mentioned above, which is indicated in Japanese Patent Laid-Open No. 2-198148, is the same as that of the semiconductor device with reinforcement of the present invention. According to the tape carrier type semiconductor device with built-in chip capacitors of this embodiment, a device having, for example, memory LSIs and logic LSIs such as micro-processors or address decoders which are mixed and stacked has a function which is the same as that of the current on-board type memory module and a semiconductor device with external dimensions which are similar to those of an SOJ type device can be formed.

Embodiment 5

Figure 11:
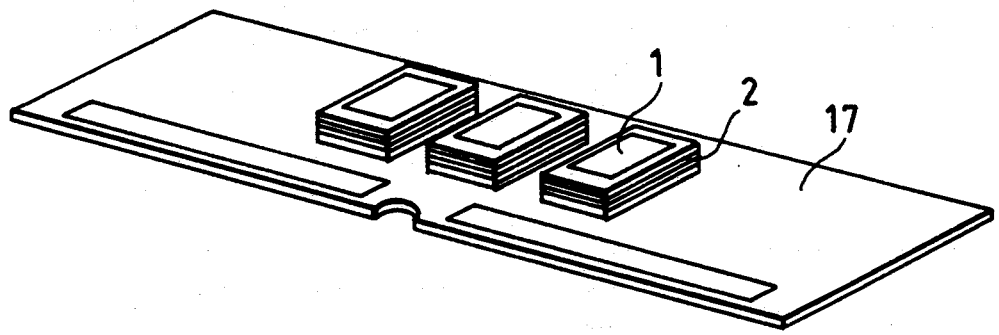
FIG. 11 is a schematic perspective view of an electronic circuit device of a further different embodiment of the present invention wherein a plurality of tape carrier type semiconductor devices are mounted on a substrate.

A device is formed by stacking four layers in the state that a tape carrier type DRAM 1M words by 4 bits long is used and ceramic capacitors 3 with a capacity of 0.1 to 1 μF for improving characteristics are mounted on the frame 2, and 8 devices are mounted on a substrate 17 for a 72-pin SIMM (single in-line memory module) under the IEEE specification, and a 16-MB memory module is formed. The shape of three devices which are mounted is shown in FIG. 11. In the case of a conventional TSOP (thin small outline package), although depending on the mounting pitch, at most about 9 LSIs can be mounted. However, according to the structure of the present invention, when a mounting area which is similar to that of a TSOP can be ensured, four times of LSIs can be mounted. Several LSI layers mounted on a tape carrier type package are used as an address decoder and parts for improving characteristics are mounted and stacked on the frame 2. By mounting devices on both the top and bottom surfaces of the substrate 17, the device mounting pitch can be spread as far as possible and a free area can be formed between neighboring devices, so that even if the substrate is changed to a one with high thermal conductivity due to changing of the material, the heat radiation efficiency from each device into the atmosphere can be increased and LSIs with high power consumption can be mounted on it.

For example, to improve the thermal conductivity of the substrate, a substrate wherein the inner copper foil content is increased can be used.

As obvious from the above embodiments, according to the semiconductor device with reinforcement of the present invention, there is no need to solder capacitors for improving high frequency characteristics later and devices can be mounted in high density in a small mounting area, so that it is suitable to semiconductor devices used in personal computers and work stations and the entire device can be miniaturized and hyper-functioned.

In the aforementioned drawings, each same numeral indicates the same part.

What is claimed is:

1. A multi-chip semiconductor device with reinforcement and chip parts comprising a plurality of semiconductor device layers which are stacked, wherein each of said semiconductor device layers has a tape carrier type semiconductor module and a frame having electrodes on the both side thereof and having at least one first hole or depression in which said tape carrier type semiconductor module is mounted, said electrodes and said tape carrier type semiconductor module being electrically connected, said frame further having at least one second hole or depression in which said chip parts are mounted, said chip parts being comprised of at least one of a capacitor and resistor, and wherein each of said semiconductor device layers has through holes for connecting said electrodes of respective ones of said semiconductor device layers, said electrodes having the same function with respect to each said tape carrier type semiconductor module.

2. A multi-chip semiconductor device according to claim 2, wherein said frame has a structure comprised of a plurality of circuit layers which are stacked and wherein said circuit layers are electrically connected with each other through conductor portions to form an electric circuit with said tape carrier type semiconductor module and said chip parts comprised of at least one of a capacitor and resistor.

3. A multi-chip semiconductor device according to claim 1, wherein the types of LSI chips mounted on said semiconductor device layers are of the same type.

4. A multi-chip semiconductor device according to claim 1, wherein LSI chips mounted on said semiconductor device layers are of at least two different types.

5. A multi-chip semiconductor device according to claim 1, wherein at least one wiring pattern comprised of a thin metal layer on said frames is enlarged in area with no relation to an electric circuit to improve a heat release efficiency of said semiconductor module.

6. A multi-chip semiconductor device according to claim 1, wherein said chip parts mounted in said second holes or on electrodes at said second depression on said frames are chip capacitors which serve for improving electric properties at high speed operation of LSIs on said tape carrier type semiconductor modules connected electrically to said frames.

7. A multi-chip semiconductor device according to claim 1, wherein each of said frames is comprised of glass-epoxy.

8. A multi-chip semiconductor device according to claim 2, wherein the types of LSI chips mounted on said semiconductor device layers are of the same type.

9. A multi-chip semiconductor device according to claim 2, wherein LSI chips mounted on said semiconductor device layers are of at least two different types.

10. A multi-chip semiconductor device according to claim 2, wherein at least one wiring pattern comprised of a thin metal layer on said frames is enlarged in area no relation to an electric circuit to improve a heat release efficiency of said semiconductor device.

11. A multi-chip semiconductor device according to claim 2, wherein said chip parts mounted in said second holes or on depression-shaped electrodes on said frames are chip capacitors which serve for improving electric properties at high speed operation of LSIs on said tape carrier type semiconductor modules connected electrically to said frames.

12. A multi-chip semiconductor device with reinforcement, comprising frames, flexible circuit layers, chip parts and tape carrier type semiconductor modules, wherein said semiconductor device is comprised of a plurality of semiconductor device layers which are stacked and each of which has a frame having conductive electrodes on both sides thereof, said frame having at least one hole or depression, and a thin flexible circuit layer having a specified circuit on a surface thereof, said thin flexible circuit layer being connected electrically to one surface of said frame, wherein at least one of said chip parts comprised of at least one of a capacitor and a resistor is mounted in said at least one hole or depression on said frame or is mounted on said flexible circuit layer in each of said semiconductor device layers, wherein each of said tape carrier type semiconductor modules is mounted on and connected electrically to a surface of said frame on a side thereof opposite to the side which said flexible circuit layer is connected, and wherein each of said semiconductor device layers has through-holes for connecting said electrodes of respective ones of said semiconductor device layers, said electrodes having the same function with respect to each of said tape carrier type semiconductor modules.

13. A multi-chip semiconductor device according to claim 12, wherein said frame has a structure comprised of a plurality of circuit layers which are stacked and wherein said circuit layers are electrically connected with each other through conductor portions to form an electric circuit with said flexible circuit layer.

14. A multi-chip semiconductor device according to claim 12, wherein the types of LSI chips mounted on said semiconductor device layers are of the same type.

15. A multi-chip semiconductor device according to claim 12, wherein LSI chips mounted on said semiconductor device layers are of at least two different types.

16. A multi-chip semiconductor device according to claim 12, wherein at least one wiring pattern comprised of a thin metal layer on each of said frames is enlarged in area with no relation to an electric circuit to improve a heat release efficiency of said semiconductor device.

17. A multi-chip semiconductor device according to claim 12, wherein at least one metal foil pattern for heat release is provided on said flexible circuit layers, said metal foil pattern being enlarged in area with no relation to an electric circuit to improve a heat release efficiency of said semiconductor device.

18. A multi-chip semiconductor device according to claim 12, wherein said chip parts are mounted in said holes or on depression-shaped electrodes on said frames are chip capacitors which serve for improving electric properties at high speed operation of LSIs on said tape carrier type semiconductor modules connected electrically to said frames.

19. A multi-chip semiconductor device according to claim 12, wherein said semiconductor device layers are stacked so that said flexible circuit layer of each of said semiconductor device layers is located between a lower surface of the frame of said semiconductor device layer which said flexible circuit layer is a part of and an upper surface of the frame of said semiconductor device layer which is below the semiconductor device layer which said flexible circuit layer is a part of.

20. A multi-chip semiconductor device according to claim 12, wherein each of said frames is comprised of glass-epoxy.

21. A multi-chip semiconductor device according to claim 12, wherein each of said semiconductor device layers is formed so that an upper surface of the frame of the semiconductor device layer has an opening, wherein said flexible circuit layer of said semiconductor device layer is mounted on the bottom surface of the frame and forms a bottom for the opening, and wherein the tape carrier type semiconductor module of the semiconductor device layer is located within the opening, with lead electrodes of said tape carrier type semiconductor module being connected to the upper surface of the frame.

22. A multi-chip semiconductor device according to claim 13, wherein at least one metal foil pattern for heat release is provided on said flexible circuit layers, said metal foil pattern being enlarged in area with no relation to an electric circuit to improve a heat release efficiency of said semiconductor module.

23. A multi-chip semiconductor device according to claim 13, wherein at least one thin metal layer on said frames and at least one metal layer on said flexible circuit layers there are provided patterns for heat release enlarging the area of said patterns with no relation to an electric circuit to improve a heat release efficiency of said semiconductor module.

24. A multi-chip semiconductor device according to claim 13, wherein said chip parts mounted on said flexible circuit layers are chip capacitors which serve for improving electric properties at high speed operation of LSIs on said tape carrier type semiconductor modules connected electrically to said frames.

25. A multi-chip semiconductor device according to claim 13, wherein said chip parts are mounted on flexible circuit layers other than said flexible circuit layers formed on said frames.

26. A multi-chip semiconductor device according to claim 19, wherein each of said frames is comprised of glass-epoxy.

27. A circuit substrate comprising at least one multi-chip semiconductor device located on a first main surface of said substrate, wherein said multi-chip semiconductor device comprises a plurality of semiconductor device layers which are stacked, wherein each of said semiconductor device layers has a tape carrier type semiconductor module and a frame having electrodes on the both sides thereof and having at least one first hole or depression in which said tape carrier type semiconductor module is mounted, said electrodes and said tape carrier type semiconductor module being electrically connected, said frame further having at least one second hole or depression in which said chip parts are mounted, said chip parts being comprised of at least one of a capacitor and resistor, and wherein each of said semiconductor device layers has through holes for connecting said electrodes of respective ones of said semiconductor device layers, said electrodes having the same function with respect to each said tape carrier type semiconductor module.

28. A circuit substrate comprising at least one multi-chip semiconductor device located on a first main surface of said substrate, wherein said multi-chip semiconductor device comprises frames, flexible circuit layers, chip parts and tape carrier type semiconductor modules, wherein said semiconductor device is comprised of a plurality of semiconductor device layers which are stacked and each of which has a frame having conductive electrodes on both sides thereof, said frame having at least one hole or depression, and a thin flexible circuit layer having a specified circuit on a surface thereof, said thin flexible circuit layer being connected electrically to one surface of said frame, wherein at least one of said chip parts comprised of at least one of a capacitor and a resistor is mounted in said at least one hole or depression on said frame or is mounted on said flexible circuit layer in each of said semiconductor device layers, wherein each of said tape carrier type semiconductor modules is mounted on and connected electrically to a surface of said frame on a side thereof opposite to the side which said flexible circuit layer is connected, and wherein each of said semiconductor device layers has through-holes for connecting said electrodes of respective ones of said semiconductor device layers, said electrodes having the same function with respect to each of said tape carrier type semiconductor modules.

29. A stacked semiconductor device comprising a plurality of semiconductor device layers stacked on one another, wherein each of said semiconductor device layers comprises:
   a frame having an upper surface and a lower surface, wherein said frame has electrodes on said upper surface and said lower surface, and further wherein said frame has a first opening extending from the upper surface to the lower surface;
   a flexible circuit layer having a predetermined circuit formed on a surface thereof, wherein said flexible circuit layer is mounted on said lower surface of said frame to form a bottom for the first opening of said frame; and
   a tape carrier type semiconductor module located in said first opening, and including lead electrodes extending from said tape carrier type semiconductor module and connected to electrodes on said upper surface of said frame,
   wherein said frame further includes a second opening in said upper surface of the frame, and wherein a chip part selected from a group consisting of a capacitor and a resistor is located within said second opening.

30. A stacked semiconductor device according to claim 29, wherein each of said semiconductor device layers further includes through-holes extending through said frames for connecting electrodes of respective ones of said semiconductor device layers to one another.

31. A stacked semiconductor device according to claim 29, wherein each of said frames is comprised of glass-epoxy.

32. A stacked semiconductor device comprising a plurality of semiconductor device layers stacked on one another, wherein each of said semiconductor device layers comprises:
   a frame having an upper surface and a lower surface, wherein said frame has electrodes on said upper surface and said lower surface, and further wherein said frame has a first opening extending from the upper surface to the lower surface;
   a flexible circuit layer having a predetermined circuit formed on a surface thereof, wherein said flexible circuit layer is mounted on said lower surface of said frame to form a bottom for the first opening of said frame; and
   a tape carrier type semiconductor module located in said first opening, and including lead electrodes extending from said tape carrier type semiconductor module and connected to electrodes on said upper surface of said frame,
   wherein said semiconductor device layer further comprises a chip part selected from a group consisting of a capacitor and a resistor, wherein said chip part is mounted on said flexible circuit layer.

33. A stacked semiconductor device according to claim 32, wherein each of said semiconductor device layers further includes through-holes extending through said frames for connecting electrodes of respective ones of said semiconductor device layers to one another.

34. A stacked semiconductor device according to claim 32, wherein each of said frames is comprised of glass-epoxy.

* * * * *